United States Patent

[11] 3,596,115

[72] Inventor Gerhard Conzelmann
Leinfelden-Unteraichen, Germany
[21] Appl. No. 819,048
[22] Filed Apr. 24, 1969
[45] Patented July 27, 1971
[73] Assignee Robert Bosch GmbH
Stuttgart, Germany
[32] Priority Apr. 27, 1968
[33] Germany
[31] P 17 64 234.1

[54] INTEGRATED MONOLITHIC SEMICONDUCTOR VOLTAGE REGULATOR ARRANGEMENT
6 Claims, 6 Drawing Figs.

[52] U.S. Cl. .......... 307/303, 317/235 R, 317/235 D, 317/235 E, 317/235 Q, 317/235 X, 323/22
[51] Int. Cl. .......... H01l 19/00
[50] Field of Search .......... 317/235; 307/297, 303, 310, 288; 323/22 T, 22 Z

[56] References Cited

UNITED STATES PATENTS

| | | | |
|---|---|---|---|
| 3,412,460 | 11/1968 | Lin | 317/235 |
| 3,426,254 | 2/1969 | Bouchard | 317/235 |
| 3,436,282 | 4/1969 | Shoda | 317/235 |
| 3,476,618 | 11/1969 | Phillips | 317/235 |

*Primary Examiner*—Jerry D. Craig
*Attorney*—Michael S. Striker

ABSTRACT: A monolithic semiconductor voltage regulator in which a lightly doped epitaxial layer is grown on a relatively heavily doped substrate. The electrical resistance of the epitaxial layer is high compared to that of the substrate. Power transistors and preamplifying transistors are formed within the monolithic semiconductor chip through isolation diffusion through the epitaxial layers. A first diffusion is then applied to the epitaxial layer within the isolation zone, and a second diffusion is applied within said first diffusion. The power transistor and the auxiliary transistors are structured so that they are complementary transistors. The power transistor may be formed as a substrate transistor and connected in common collector circuit. The doping substance for the substrate has a diffusion coefficient which is substantially lower than the diffusion coefficient of the doping substance used for the epitaxial layer.

INVENTOR
Gerhard CONZELMANN
By

Michael S. Striker
his ATTORNEY

INVENTOR
Gerhard CONZELMANN
By his ATTORNEY

INVENTOR
Gerhard CONZELMANN
By
Michael S. Striker
his ATTORNEY

INTEGRATED MONOLITHIC SEMICONDUCTOR VOLTAGE REGULATOR ARRANGEMENT

BACKGROUND OF THE INVENTION

The present invention resides in a monolithic semiconductor arrangement which contains at least one power transistor and one or more preamplifying transistors within a semiconductor member. The arrangement is particularly applicable to voltage regulators for light generators in motor vehicles.

It is known in the art to produce electronic circuits with a number of active and passive elements, such as transistors, diodes, resistors and capacitors within a single semiconductor chip through the well-known planar process. In this process the required P or N conducting zones are diffused into an epitaxial layer with a specific resistance between 0.1 and 1 ohm centimeter. The epitaxial layer lies upon an oppositely doped high-resistance substrate of, for example, 5 ohm cm. The PN junction between the substrate and epitaxial layers isolate the individual elements. In order to fulfill this function, the PN junction may not be of polarity in the conducting direction at any location and in any possible operating state. The collector terminals can, therefore, only be taken out from above. As a result, relatively large collector path resistances are realized so that transistors for small collector currents only are permitted.

Whereas the conventional integrated circuits have only transistors of one conductivity type such as either NPN or only PNP, arrangements are also known in which complementary pairs are used. In such arrangements, the transistor which is complementary to the usual structure is either a lateral transistor or a substrate transistor. In view of the higher resistance substrate, the substrate transistors also have large path resistances so that they are not applicable for large currents.

In order to realize greater output current or output power, crystalline chips are provided for the low power preamplifying stages and the power stages. Separate such crystalline chips are used for these stages and are mounted within the same housing. This conventional solution, however, requires two different crystalline chips with different production processes for fabrication and, in addition, auxiliary isolations and conducting paths in the housing. For this reason, this conventional solution is considerably complex.

Accordingly, it is the object of the present invention to provide a monolithic semiconductor arrangement usable for a voltage regulator in motor vehicle light generators, in which the power transistor is arranged together with one or more low power amplifying stages in a single semiconductor chip. The power transistor currents are to be at least of the order of 2 amperes with a switching frequency of at least 20 Hz. for continuous operation. It is also an object of the present invention to provide such an integrated circuit with the least number of diffusion processes.

The object of the present invention is achieved through a semiconductor arrangement in which, according to the present invention, the semiconductor chip consists of a heavily doped, low-resistance substrate upon which is situated an epitaxial layer which is lightly doped and of high resistance. The power transistor and the preamplifying transistors are formed in this combination complementary to each other. The power transistor, at least, is advantageously in the form of a substrate transistor. Particular advantages are realized when the power transistor is driven in common collector circuit.

SUMMARY OF THE INVENTION

A monolithic semiconductor arrangement for use as voltage regulators in motor vehicles. A semiconductor substrate is heavily doped and has a relatively low electrical resistance. A substantially lightly doped epitaxial layer resides on the substrate and has a relatively high electrical resistance compared to that of the substrate. The combined substrate and epitaxial layer constitute a monolithic semiconductor chip. Within this chip is contained at least one power transistor and one preamplifying or auxiliary transistor. The structures of the two transistors are arranged so that they are complementary to each other. The power transistor may be formed as a substrate transistor and driven in common collector circuit. The doping substance for the substrate has essentially a diffusion coefficient which is lower than that of the doping substance used for the epitaxial layer. The doping substance for the substrate in one embodiment may be indium or boron, whereas arsenic or antimony is used for the doping substance of the epitaxial layer. Aluminum or boron may be used for the isolating diffusion. In this same embodiment, boron may be used for the first conductive diffusion zone, and phosphorous may be used for the second conductive diffusion zone.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

DESCRIPTION OF THE PREFERRED EMBODIMENTS

Figure 1:
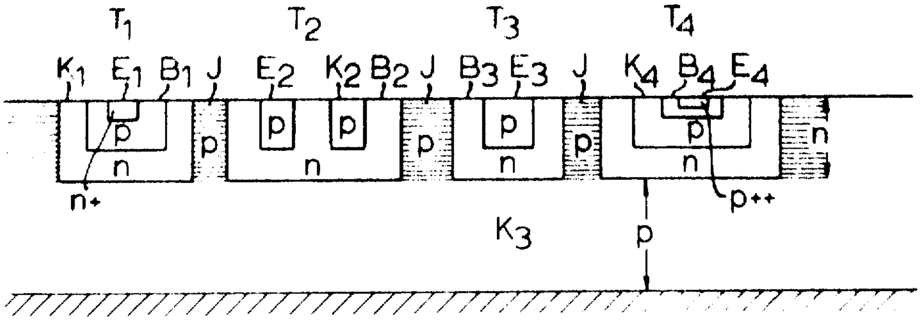
FIG. 1 is a cross-sectional view of the structure of an integrated circuit.

Referring to the drawing, the conventional structures of integrated circuits as currently available are shown in cross section in FIG. 1. In that embodiment, the transistor T1 is a conventional integrated NPN transistor, whereas the transistor T2 is a complementary PNP lateral transistor. The transistor T3 is a complementary PNP substrate transistor, and transistor T4 is also a complementary PNP transistor which is generated through an additional $P^{++}$ diffusion. The integrated circuit can also include additional such transistors T1 to T4 which may be introduced, in the commonly known manner, in the form of diodes. Deposited upon the P doped high-resistance substrate with a resistance $\rho$ of approximately 5 ohm cm., is a low-resistance N doped epitaxial layer with a thickness of approximately 10 $\mu$m. and a specific resistance $\rho$ of approximately 0.5 ohm cm. Through the isolating diffusion J, this epitaxial layer is subdivided into N conducting tubs which receive the individual transistors. In order to be effective, the isolating diffusion must reach past the epitaxial layer to the P substrate.

A P diffusion which is not as deep forms the base B1 of the transistor T1. A still less deep $N^+$ diffusion, the emitter E1 of the transistor T1 is realized. The remaining N epitaxial tub is for the collector zone K1 of the transistor T1. This collector zone is accessible from the top for a terminal.

In the laterally arranged complementary PNP transistor T2, the N epitaxial tub or basin forms the base B2. The collector K2 and the emitter E2 may, on the other hand, be generated through the aforementioned P diffusion required for the bases B1.

The complementary PNP substrate transistor T3 may also be realized without an additional diffusion. In this transistor, the N epitaxial tub or basin forms the base B3, whereas the P diffusion yields the emitter E3 and the P substrate provides the collector K3.

Another method by which to realize complementary transistors resides in an additional $P^{++}$ diffusion as in transistor T4. The N epitaxial layer forms here the isolating tub, and the first P diffusion provides the collector K4. The $N^+$ diffusion yields the base B4, and the additional $P^{++}$ diffusion forms the emitter E4. The voltage rating of the collector-base or base-emitter paths are, however, less in this arrangement than in the transistors T1 to T3.

Even when the polarities in FIG. 1 are common, the structure may be basically produced in a complementary manner, whereby the P zones are replaced through N zones, and the N zones are replaced through P zones.

Arrangements in accordance with FIG. 1 require at least three diffusions in the form of an isolating diffusion (P), a base diffusion B1 (P), and an emitter diffusion E1 ($N^+$).

Figure 2:
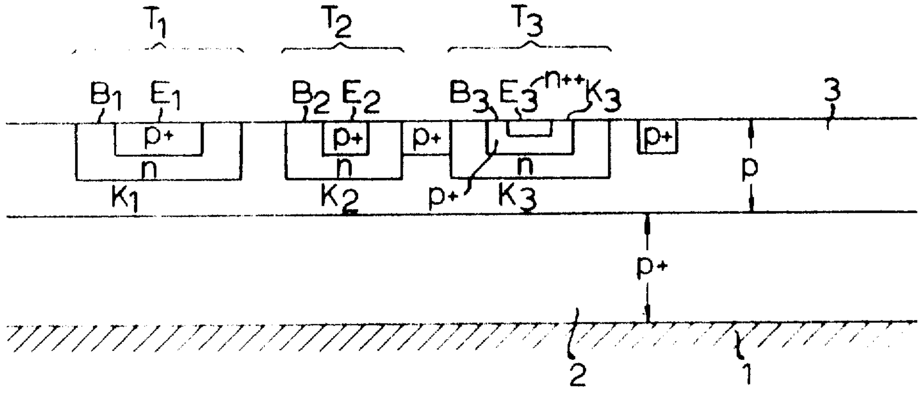
FIG. 2 is a cross-sectional view of a monolithic structure, in accordance with the present invention, in which an epitaxial layer upon a substrate is of the same conductivity type as the substrate.

The structure of FIG. 2 is basically formed differently in accordance with the present invention. In the shown embodiment, transistors T1 and T2 are epitaxial substrate transistors of the PNP type. Transistor T3 is a complementary NPN transistor having a structure which corresponds to the normally integrated transistor T1 in FIG. 1. It is also possible in this arrangement to include additional ones of the individual transistors T1, T2 and T3.

In contrast to the structure of FIG. 1, however, the arrangement of FIG. 2 has a metallic base 1 upon which the substrate 2 resides. This substrate 2 is very highly doped and is therefore low in resistance. The less doped epitaxial layer 3, moreover, is of the same polarity as the substrate. Three zones N, $P^+$ and $N^{++}$ are diffused in sequence to the epitaxial layer. In the PNP substrate transistors T1 and T2, the P epitaxial layer 3 forms the collector zones K1 and K2. The first N diffusion forms the bases B1 and B2, whereas the $P^+$ diffusion provides the emitters E1 and E2. The collectors of these substrate transistors are led through the extremely low-resistance substrate 2 in the downward direction. For this reason, the collectors have similar low collector path resistances as in epitaxial power transistors produced separately. The low power stages are generated with the complementary transistors T3 in which the first N diffusion is designated for the collector zones K3 and the $P^+$ diffusion is designated for the base B3. The emitters E3 of the T3 transistors are produced through the second N diffusion ($N^{++}$). Since the N zones of the first N diffusion are embedded in the P epitaxial layer 3, this structure does not require any isolating diffusion. As a result, this structure may also be realized through three diffusions, similarly to that of FIG. 1. In order to improve the isolation, the $P^+$ diffusion can also be situated between the N tubs or basins and be connected with the substrate, as illustrated between the transistors T2 and T3 or to the right of transistor T3.

Figure 3:
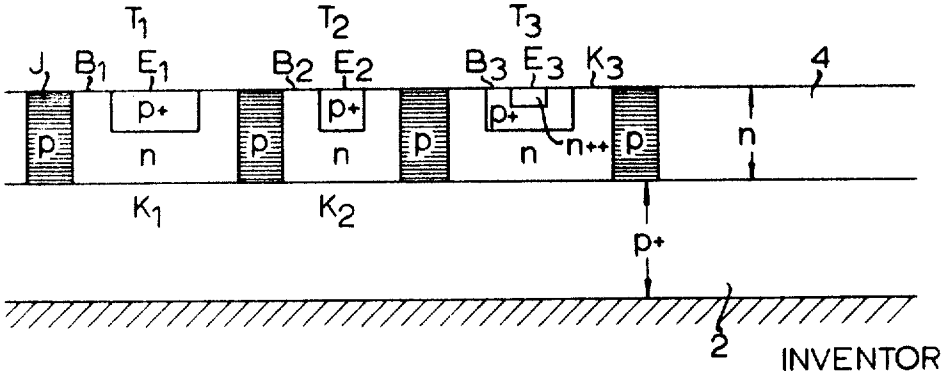
FIG. 3 is a cross-sectional view through a monolithic structure, in accordance with the present invention, in which the epitaxial layer on a substrate is of the opposite conductivity type as the substrate.

A particularly advantageous embodiment of the present invention resides in the structure of FIG. 3 in which the homogenously doped base zone is provided for the particularly critical power transistors.

The highly doped $P^+$ substrate 2 carries a less doped N epitaxial layer 4 from which the bases B1 and B2 of both power transistors T1 and T2, as well as the collector K3 of the complementary transistor T3 are formed. The individual transistor systems become separated from each other through the first P diffusion J which serves as an isolating diffusion. The emitters E1 and E2 of the power transistors T1 and T2 or the base B3 of the complementary transistor T3 are generated through the subsequent $P^+$diffusion. The emitter E3 of the transistor T3 becomes generated in a third diffusion ($N^{++}$).

This structure also requires three diffusions. The structure has a special advantage that all transistors may be readily produced with the same collector voltage. This is due to the condition that the collector voltage is determined solely through the doping of the N epitaxial layer when sufficient space prevails between the $P^+$ diffusion zone and the $P^+$ substrate. Corresponding to the discrete power transistors with homogenous base, the collector cutoff layer extends with increasing collector voltage into the base zone in the substrate transistors T1 and T2.

The structures in accordance with the present invention exhibit a highly doped P substrate 2, in contrast with the conventional structures. As a result, the doping substance of the substrate diffuses into the N epitaxial layer during the subsequent processes which require high temperatures. Accordingly, the substrate is doped with substances which exhibit lower diffusion coefficients than the doping substances for the zones to be diffused thereinto. From the opposite point of view, it is advantageous to use substances with high diffusion coefficients for the isolation diffusion. The following substances are suggested by way of example:

| | | | | |
|---|---|---|---|---|
| Substrate | $p^+$ | Indium, boron | $n^+$ | Arsenic, antimony. |
| Epitaxy | n | Arsenic, antimony | p | Indium, boron |
| Isolating diffusion | p | Aluminum, boron | n | Phosphorous. |
| 1. Diffusion zone | $p^+$ | Boron | $n^+$ | Do. |
| 2. Diffusion zone | $n^{++}$ | Phosphorous | $p^{++}$ | Boron. |

The formation of resistors and blocking capacitance layers in the structures of FIGS. 2 and 3, does not differ from previous solutions. Accordingly, these were not particularly pursued.

Figure 4:
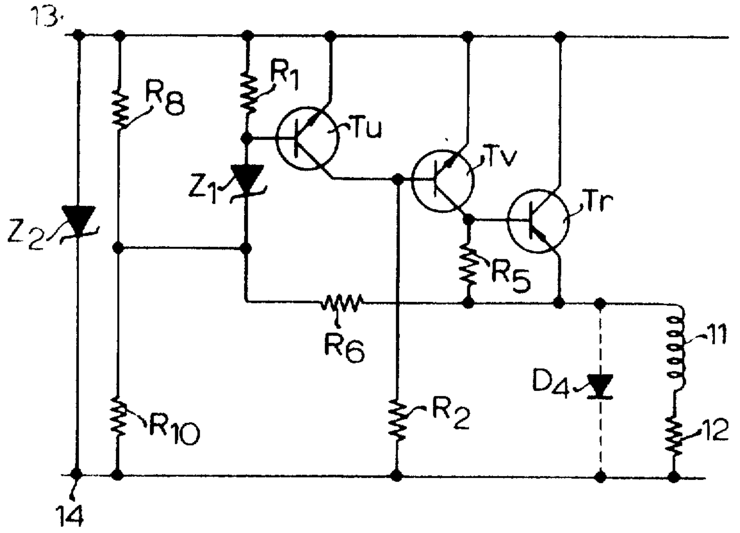
FIG. 4 is an electrical schematic diagram and shows the circuitry for a voltage regulator applicable to motor vehicles.

The technical circuit application of these structures are described, in what follows, in a voltage regulator for a light generator in a motor vehicle, by way of example:

The PN transitions from the epitaxial layer 4 to the substrate 1 must always be of polarity in the cutoff or nonconducting direction, for the purpose of meeting the isolating condition. As a result, the operational resistors of the power transistors must be arranged in the emitter circuit, since the collectors of the power transistors are connected with the substrate. In FIG. 4, the power transistor T*r* operates as a grounded or common collector circuit in which the emitter circuit includes the excitation coil 11 of a light generator with its copper resistance 12, not further shown. Thus, the light generator is represented by the excitation coil 11 and the resistance 12. The voltage regulator operates on the basis of the on-off principle. A diode D4 is connected in parallel with the series circuit of the excitation coil 11 and resistor 12. The power transistor T*r* is controlled, in operation, through a preamplifier with the transistors T*u* and T*v*. The collector of the transistor T*u* is connected to a resistor $R_2$ which is, thereby, the collector resistor of this transistor. A zener diode $Z_1$ connected to the base of the transistor T*u* serves as a voltage reference element. A resistor $R_1$ is connected between the base of the transistor T*u* and the emitter of this transistor. Similarly, a resistor $R_5$ is connected between the base and emitter of the transistor T*r*. These base-emitter resistors $R_1$ and $R_5$ of the transistors T*u* and T*r* serve to provide increased temperature stability of the voltage regulator. A voltage divider consisting of resistors $R_8$ and $R_{10}$ is connected across the voltage supply lines 13 and 14 for the purpose of adjusting or setting the value of the desired voltage of the regulator. A resistor $R_6$ is connected between the emitter of the power transistor T*r* and the junction between the resistors $R_8$ and $R_{10}$ of the voltage divider. This resistor $R_6$ is a coupling resistor which assures, in conjunction with the voltage divider, that the power transistor is either fully conducting or completely turned off. Through this arrangement, undesired intermediate operational states of the voltage regulator are avoided, and the accompanying high power losses within the power transistor T*r* are also avoided. The zener diode $Z_2$ connected across the voltage divider of resistors $R_8$ and $R_{10}$ serves to inhibit the appearance of undesired voltage spikes. The supply lines 13 and 14 are also the terminals of the light generator, not shown.

As long as the terminal voltage of the light generator is smaller than the desired voltage, the zener diode $Z_1$ remains in the nonconducting state and the transistor T*u* is also thereby turned off. The base of the transistor T*v* has then full operating voltage applied to it through the resistor $R_2$, and the transistor T*v* is thereby turned on. With transistor T*v* conducting, the base of the transistor *Tr* is substantially connected to the terminal 13. The power transistor *Tr* is consequently turned on and the light generator becomes fully excited so that its voltage rises to the level applied to the terminals 13 and 14. The voltage rise of the light generator increases, in this manner, until the zener diode $Z_1$ becomes conducting. At that point, the transistor *Tu* is turned on or conducts, whereas transistor *Tv* and also transistor *Tr* become turned off. The remaining current flow in the excitation coil 11 can dissipate through the diode $D_4$. With the decline of the magnetic field, the voltage of the light generator also drops. The zener diode $Z_1$ and the transistor *Tu* become consequently again nonconducting, and a cycle of operation begins anew.

The circuit shown in FIG. 4 may be constructed on either a P or N substrate. If the negative terminal of the light generator of the motor vehicle is connected to ground potential, it is essential to use a P conducting substrate. With this condition, the collector of the power transistor can also be connected to ground potential. In this manner, no isolation is required between the housing and the heat removing ground. A further advantage is also available through this design. The base zone of the power transistor *Tr* is then of the N type, and due to the greater inertia of the electrons with the same applied collector voltage for the transistor *Tr*, a higher conductivity is realized than with P type of base zone.

In the circuit of FIG. 4, the zener diode $Z_1$ can be integrated with the remaining components or elements. The zener diode $Z_1$ is formed through the $N^{++}$ diffusion. During this diffusion, a second $N^{++}$ emitter within the base zone B3 is formed as well as the structure for the transistor *Tu* similar to that provided for the transistor T3 in accordance with FIG. 2 or 3. In the remaining diffusion processes, the zener voltage lies between 6 volts and 3 volts. In this voltage region, the temperature coefficient of the zener diode varies steeply in rising as a function of increased voltage in the positive direction from a zero value corresponding to 6 volts. The circuit is to operate, on the other hand, over a wide temperature region, and for this reason a temperature coefficient of the zener diode $Z_1$ is compensated by one or more of the diodes $D_1$, $D_2$, and $D_3$ connected in series. The design decision whether to use these diodes and the number to be used for compensating purposes is dependent upon the measurement of the zener voltage $Z_1$.

Zener diodes can exhibit noise in excess of 100 mv. With discrete elements, such noise may be suppressed through capacitors of the order of *n*F, connected in parallel. Noise or disturbances from the exterior are also filtered through circuits containing capacitors. In monolithic integrated circuits, however, this approach is not feasible. For this reason, the applicable transistors are driven into the saturation region. The function of the capacitors used in the conventional control arrangement is assumed through the storage effects of the excess charged carriers at the PN junction.

Figure 5:
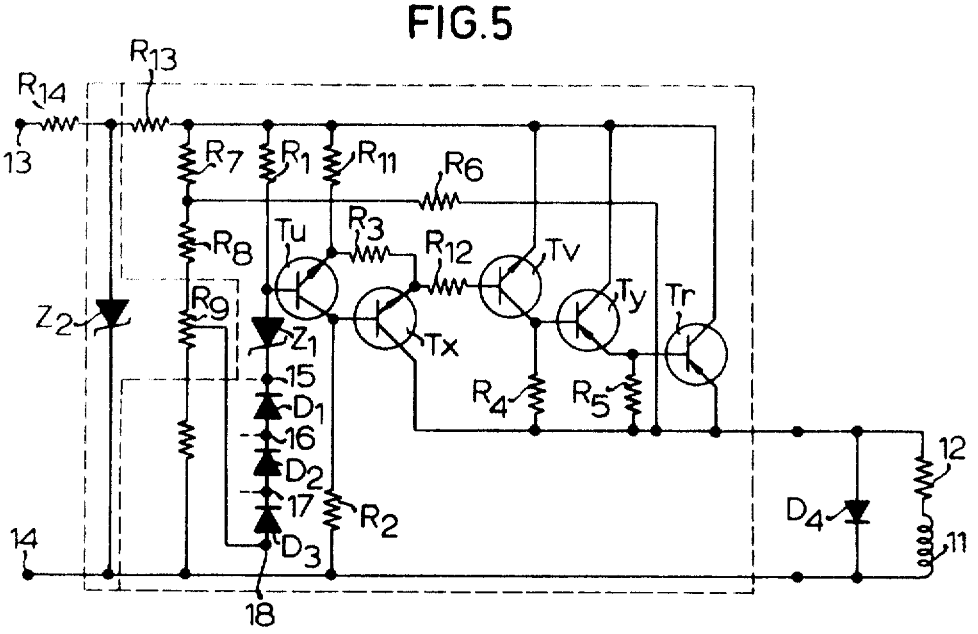
FIG. 5 is an electrical schematic diagram of a voltage regulator derived from the scheme of FIG. 4.

FIG. 5 shows an embodiment which provides for an excitation current of the order of 4 amperes. In this embodiment, the negative terminal lies at the substrate and the housing of the integrated regulator circuit. The integrated portion of the circuit is enclosed within the broken lines. The power transistor *Tr* is realized through a number of parallel connected transistors T1, T2, as shown in FIGS. 2 and 3. The preamplifying transistors *Tu* and *Tv* are realized through the transistor systems of the type shown there in relation to the transistor T3.

For the purpose of increasing the current amplification, two transistors *Tx* and *Ty* are connected in common collector circuit in contrast to FIG. 4. The transistor *Tx* is made in the form of an NPN transistor T3 in accordance with FIG. 2 or 3, and the transistor *Ty* is formed as a power transistor in accordance with the transistors T1 or T2 of FIGS. 2 or 3. The diodes D1, and D2, and D3 with the terminals 15, 16, 17 and 18 serve the purpose of compensating against temperature variations of the zener diode $Z_1$. The desired voltage of the voltage regulator is set or adjusted by the potentiometer R9, for example.

The coupling resistor R6 in FIG. 4 has a high-resistance value and for this reason occupies a relatively large amount of space. In view of this condition, further coupling arrangements are given in conjunction with FIG. 5.

If the coupling network is realized through the resistors $R_6$ and $R_7$, then the resistors $R_{11}$, $R_{12}$, $R_{13}$ and $R_{14}$ have zero resistance values. If, on the other hand, the coupling network is realized through resistors $R_8$, $R_{11}$, and $R_{12}$, then the resistors $R_7$, $R_{13}$, and $R_{14}$ have each zero resistance value, and the resistor $R_6$ is infinite. Should the coupling network be realized through resistor $R_{13}$, then the resistor $R_7$, $R_{11}$, $R_{12}$, and $R_{14}$ are each zero resistance value and the resistor $R_6$ is infinite. If, finally, the coupling network is obtained through resistor $R_{14}$, then the resistors $R_7$, $R_{11}$, $R_{12}$ and $R_{13}$ are of zero resistance value, and the resistor $R_6$ is infinite.

The most simple coupling is realized through the resistor $R_{13}$ or $R_{14}$. The latter is arranged for this reason, in the terminal connection of the voltage regulator. As a result, the heat losses, in this case, which may be of the order of 1 watt for an excitation current of 4 amperes, are dissipated outside of the integrated circuit. The coupling may be integrated through resistors $R_{11}$ and $R_{12}$ with low-resistance value and with extremely low power dissipation and thereby small effective surface. The temperature function or effect of the base-emitter voltage of the transistor *Rv* is, thereby, oppositely directed to the current amplification factors. Any residual amount can be compensated, when necessary, through resistor $R_{12}$ which may have a value between zero and several thousand ohms.

Protection against excess voltages is realized through the zener diode $Z_2$ which may lie outside or within the integrated circuit. When the zener diode $Z_2$ is part of the integrated circuit, it is in the form of a substrate diode. If, on the other hand, the zener diode is not to be integrated, then the zener voltage is determined at a level below the collector breakdown voltage of the integrated circuit.

The diode $D_4$ is not part of the integrated circuit. The zener diode $Z_2$ and the diode $D_4$ can, however, both be contained within a single housing together with the integrated circuit.

In the arrangement of FIG. 5, only the transistors *Tx*, *Tv*, *Ty* and *Tr* are driven into the saturation region. Should this not be adequate from the viewpoint of meeting noise conditions in stringent requirements, one or more auxiliary transistors, preferably two, may be connected between the transistors *Tu* and *Tx*.

For illustrative purposes, the doping of a structure in accordance with FIG. 3, is given for a desired voltage of approximately 14 volts for the regulator:

CONCENTRATION

Substrate—In ($10^{19}$ cm.$^3$, homogeneous)
Epitaxy—As or Sb ($1\cdot10^{16}$ . . . $3\cdot10^{16}$ homogeneous)
Isolating diffusion—Al (B) ($10^{19}$($10^{21}$) surface)
$p^+$-Diffusion—B ($10^{19}$ surface)
$n^{++}$-Diffusion—P ($10^{21}$ surface)
Epitaxial layer thickness—ca. 8–10 mm.$\cdot10^{-3}$
Depth of $n^{++}$-$p^+$ junction—2 mm.$\cdot10^{-3}$
Depth of $p^+$-n junction—2.5 mm.$\cdot10^{-3}$
Depth of n-$p^+$ junction—5.5 mm.$\cdot10^{-3}$.

As a result of the heavily doped substrate, the product of the diffusion coefficient and the time is to be maintained as small as possible in the individual diffusion processes. The isolating diffusion is, therefore, the first process to be carried out and in a manner such that the doping substance of the substrate first be attained during the subsequent diffusion process.

The circuit of a regulator shown in FIG. 4 is of particular advantageous design and simple in contrast to the circuit of FIG. 5. In this embodiment of FIG. 6, the circuit is integrated upon an $N^+$ substrate. The power stage for the excitation current in the field winding or coil 11 of the motor vehicle light generator, consists of two transistors $T_{15}$ and $T_{16}$ of the NPN type and interconnected to form the conventional Darlington arrangement. In place of the preamplifier transistor *Tu* in FIG. 4, two PNP transistors $T_{11}$ and $T_{12}$ are provided and also interconnected in the form of an emitter follower pair which lends itself particularly well to integrated circuitry. A second emitter follower pair is provided by the transistors $T_{13}$ and $T_{14}$ of the PNP type. The transistors $T_{11}$ to $T_{16}$ can be formed together with the diodes D1, D2, and D4, as well as the zener diodes and the resistors $R_1$ to $R_{16}$ on a heavily doped $N^+$ substrate with lightly doped P epitaxial layer with polarities reversed from that shown in FIGS. 2 and 3. Such formation of these components may be accomplished through the conventional technique. It is of particular advantage in this embodiment, when the resistor $R_{16}$ of the transistor $T_{14}$ is connected to the junction or tap of the input voltage divider with associated resistors $R_9$ and $R_{10}$. Such arrangement serves to save a separate feedback resistor.

In considering the voltage aspects and functions which are of particular importance in integrated regulators, the desired voltage of the regulator is established through the voltage of the series circuit including the reference element $Z_1$ with the diodes $D_1$, $D_2$ and the emitter diode of transistor $T_{11}$. The regulator voltage is, furthermore, established through the relative resistance values of the components of the input voltage divider with resistors $R_8$, $R_9$ and $R_{10}$. These elements cannot be integrated with considerable accuracy or precision. The integrated regulator must, therefore, be trimmed or adjusted subsequently. Regardless of such subsequent adjustment, the prescribed temperature function of the desired voltage should be retained in the neighborhood of −5 mv./° C. to −15 mv./° C. In the embodiment of FIG. 5, temperature compensation is realized so that the number of compensating diodes $D_1$ and $D_2$, driven in the conducting direction, is made dependent upon breakdown voltage of the zener diode $Z_1$. It is required that this breakdown voltage be measured prior to metallizing for depositing a conducting layer on the integrated circuit and also before using the different conductive masks.

Integrated resistors have positive temperature coefficients with values which may be adjusted with the aid of preselected surface concentrations between 0.08 percent and approximately 0.3 percent per ° C.

Figure 6:
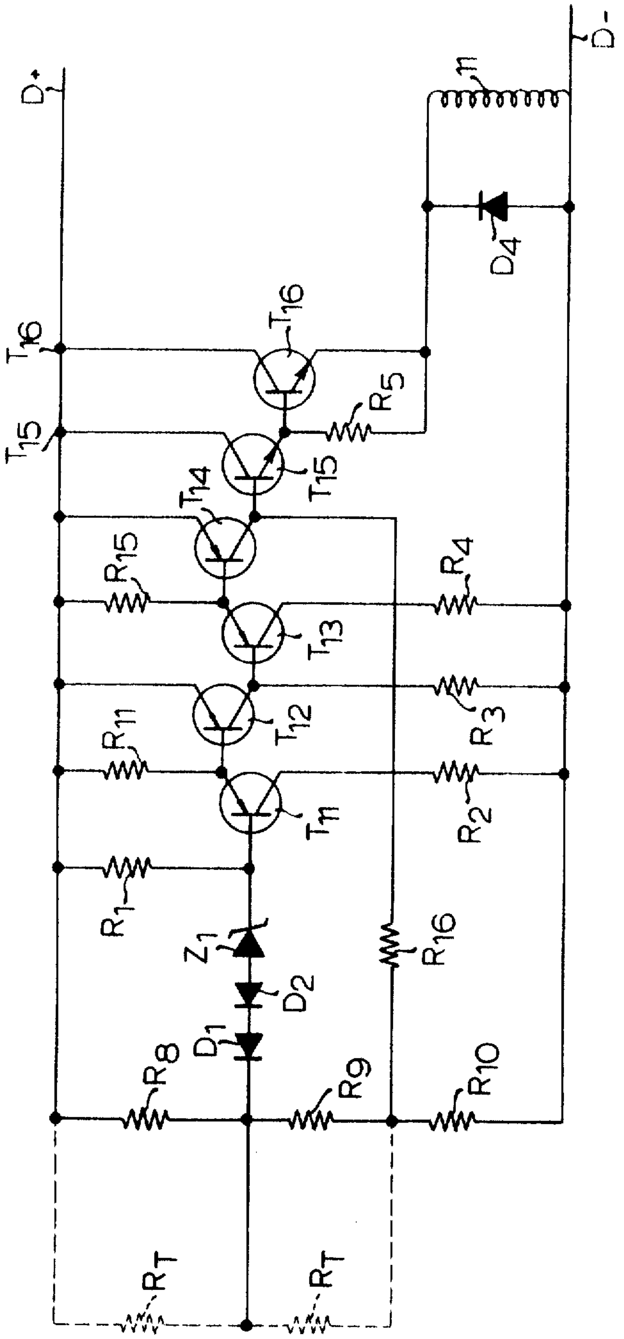
FIG. 6 is an electrical schematic diagram and shows a preferred simple embodiment of the voltage regulating circuit, in accordance with the present invention.

In order to realize the temperature compensation of the desired voltage to an external resistor, fixed resistors $R_T$ are preferably used, as shown in FIG. 6. Such resistors $R_T$ have a smaller temperature coefficient TK than the integrated resistors. Film resistors with a temperature coefficient TK of approximately 0.03 percent per ° C. are, for example, adaptable for this purpose. Through proper selection of the resistors $R_8$ and $R_9$ in FIG. 6, it is possible to maintain the temperature coefficient of the desired voltage over a broad region of the breakdown voltage of the zener diode. This situation prevails provided the resistors $R_T$ are used for adjustment purposes. The temperature function associated with the desired voltage, as described above, can then be attained even without the compensation diodes $D_1$ to $D_n$ under nonstringent conditions.

It will be understood that each of the elements described above, or two or more together, may also find a useful application in other types of constructions differing from the types described above.

While the invention has been illustrated and described as embodied in integrated voltage regulators for motor vehicles, it is not intended to be limited to the details shown, since various modifications and structural changes may be made without departing in any way from the spirit of the present invention.

What I claim as new and desire to be protected by Letters Patent is:

1. A monolithic semiconductor voltage regulator arrangement for use with a voltage generator having an output, comprising, in combination, a substantially heavily doped substrate having a relatively low electrical resistance; a substantially lightly doped epitaxial layer on said substrate and having a relatively high electrical resistance compared to said substrate, said substrate and said epitaxial layer being monolithic semiconductor means; at least one power transistor in said monolithic semiconductor means; at least one auxiliary transistor in said monolithic means, said auxiliary transistor being complementary to said power transistor and connected to said power transistor so that the latter is conductive when said auxiliary transistor is nonconductive and is nonconductive when said auxiliary transistor is conductive; a zener diode, in said monolithic semiconductor means, connected to the base of said auxiliary transistor to render the latter conductive when the zener diode conducts; at least one temperature compensating diode connected in the conductive direction in series with said zener diode within said monolithic semiconductor means; and voltage dividing means, in said monolithic semiconductor means, connected across said voltage generator output and to said compensating diode to cause said zener diode to conduct when the voltage across said voltage dividing means reaches a predetermined value.

2. The monolithic semiconductor voltage regulator arrangement as defined in claim 1, including two said auxiliary transistors connected so that one conducts when the other is cut off.

3. A monolithic semiconductor voltage regulator arrangement for use with a voltage generator having an output, comprising, in combination, a substantially heavily doped substrate having relatively low electrical resistance; a substantially lightly doped epitaxial layer on said substrate and having a relatively high electrical resistance compared to said substrate, said substrate and said epitaxial layer being monolithic semiconductor means; at least one power transistor in said monolithic semiconductor means; first and second pairs of first and second auxiliary transistors in said monolithic semiconductor means, the collector of said first transistor of a pair being connected to the base of said second transistor of the same pair, the emitter of said second transistor of said first pair being connected to the base of said first transistor of said second pair, and emitter of said second transistor of said second pair being connected to the base of said power transistor so that the conductivity and nonconductivity of any one of said transistors is dependent on the conductive state of another one of said transistors; adjustable resistor means, external to said monolithic semiconductor means, connected across the output of said voltage generator; a zener diode connected to the base of said first transistor of said first pair and to said adjustable resistor means for rendering said first transistor of said first pair conductive when said zener diode is conductive.

4. A monolithic semiconductor voltage regulator arrangement for use with a voltage generator having an output, comprising, in combination, a substantially heavily doped substrate having relatively low electrical resistance; a substantially lightly doped epitaxial layer on said substrate and having a relatively high electrical resistance compared to said substrate, said substrate and said epitaxial layer being monolithic semiconductor means; first and second power transistors, Darlington Darlington connected, in said monolithic semiconductor means; a first emitter follower pair and a second emitter follower pair, connected together, in said monolithic semiconductor means, said second emitter follower pair being connected to the base of said first power transistor; voltage dividing means in said monolithic semiconductor means connected across said generator output; a zener diode and a plurality of temperature compensating diodes connected in series with said zener diode in said monolithic semiconductor means, said zener diode and said compensating diodes being connected between said first emitter follower pair and said voltage dividing means to render said first emitter follower pair conductive when said zener diode conducts; and temperature compensating resistor means, external to said monolithic semiconductor means, connected in parallel with said voltage dividing means.

5. The arrangement as defined in claim 4, wherein said power transistors are NPN type.

6. The arrangement as defined in claim 5, wherein said first and second emitter follower pairs are PNP transistors.